(12) United States Patent
Ju et al.

(10) Patent No.: US 7,494,909 B2
(45) Date of Patent: Feb. 24, 2009

(54) METHOD OF MANUFACTURING A CHIP

(75) Inventors: Chull Won Ju, Daejeon (KR); Byoung Gue Min, Daejeon (KR); Seong Il Kim, Daejeon (KR); Jong Min Lee, Daejeon (KR); Kyung Ho Lee, Daejeon (KR); Young Il Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 125 days.

(21) Appl. No.: 11/499,116

(22) Filed: Aug. 3, 2006

(65) Prior Publication Data

US 2007/0072419 A1    Mar. 29, 2007

(30) Foreign Application Priority Data

Sep. 27, 2005    (KR) .................. 10-2005-0089724

(51) Int. Cl.
*H01L 21/00* (2006.01)
*H01L 21/76* (2006.01)
*H01L 21/46* (2006.01)
*H01L 21/44* (2006.01)
*H01L 29/40* (2006.01)
*H01L 23/02* (2006.01)

(52) U.S. Cl. .................. 438/598; 438/160; 438/443; 438/458; 438/459; 257/117; 257/118; 257/276; 257/502; 257/678

(58) Field of Classification Search .................. None
See application file for complete search history.

(56) References Cited

U.S. PATENT DOCUMENTS 6,261,943 B1 * 7/2001 Grupp .................. 438/619
6,395,630 B2   5/2002 Ahn et al.
6,485,814 B1 * 11/2002 Moriizumi et al. .......... 428/210
6,916,725 B2 * 7/2005 Yamaguchi .................. 438/459
7,119,001 B2 * 10/2006 Kang .................. 438/598
7,399,683 B2 * 7/2008 Noma et al. .................. 438/465
2003/0134453 A1 * 7/2003 Prabhu et al. ................ 438/113

(Continued)

FOREIGN PATENT DOCUMENTS

KR    2002-0012061 A    2/2002

(Continued)

OTHER PUBLICATIONS

"Development of Advanced 3D Chip Stacking Technology with Ultra-Fine Interconnection," by Kenji Takahashi et al.; *IEEE Electronic Components and Technology Conference*; 2001.

*Primary Examiner*—Matthew Smith
*Assistant Examiner*—James M Mitchell
(74) *Attorney, Agent, or Firm*—Blakely, Sokoloff, Taylor & Zafman LLP

(57) ABSTRACT

Provided are a chip, a chip stack, and a method of manufacturing the same. A plurality of chips which each include: at least one pad formed on a wafer; and a metal layer which protrudes up to a predetermined thickness from the bottom of the wafer and is formed in a via hole exposing the bottom of the pad are stacked such that the pad and the metal layer of adjacent chips are bonded. This leads to a simplified manufacturing process, high chip performance and a small footprint for a chip stack.

8 Claims, 3 Drawing Sheets

U.S. PATENT DOCUMENTS

2005/0017358 A1* 1/2005 Farnworth .................. 257/751
2005/0110157 A1* 5/2005 Sherrer et al. ............... 257/776
2005/0215054 A1* 9/2005 Rasmussen et al. ......... 438/667
2005/0224966 A1* 10/2005 Fogel et al. ................. 257/737
2006/0040451 A1* 2/2006 Lotfi et al. .................. 438/305
2006/0043535 A1* 3/2006 Hiatt .......................... 257/621
2006/0223340 A1* 10/2006 Yoneda ....................... 438/800
2007/0001266 A1* 1/2007 Arana et al. ................ 257/621
2007/0045780 A1* 3/2007 Akram et al. ............... 257/621

FOREIGN PATENT DOCUMENTS

KR    10-2005-0021078 A    3/2005

* cited by examiner

METHOD OF MANUFACTURING A CHIP

CROSS-REFERENCE TO RELATED APPLICATION

This application claims priority to and the benefit of Korean Patent Application No. 2005-89724, filed on Sep. 27, 2005, the disclosure of which is incorporated herein by reference in its entirety.

BACKGROUND

1. Field of the Invention

The present invention relates to a chip, a chip stack, and a method of manufacturing the same, and more particularly, to a chip, a chip stack, and a method of manufacturing the same in which a chip manufacturing process is simplified, chip performance is improved, and a footprint for a chip stack is made small by forming a metal layer protruding from the bottom of a wafer up to a predetermined thickness in a via hole penetrating the wafer to expose the bottom of a pad formed on the wafer.

2. Discussion of Related Art

The ongoing development of wireless communication and digital multimedia technology, coupled with increasing consumer demand, continues to fuel the trend toward miniaturization, high performance, high integration, and multi-functionality of portable digital electronic devices such as portable phones, personal digital assistants (PDA), and high performance multimedia devices.

For miniaturization of such portable digital electronic devices, system on chip (SoC) technology, in which integrated circuits (ICs) having different functions are integrated into one chip to function as a system, has been extensively researched.

However, SoC technology can only integrate ICs manufactured by the same processes into one chip. For example, SoC technology cannot be applied to a metal oxide semiconductor, a bipolar semiconductor, and a RF chip because these IC's are fabricated on different wafers.

As an alternative to SoC, research into system on package (SoP) technology is currently progressing. SoP integrates ICs not integrated into one chip by SoC. In order to implement SoP technology, a method of stacking ICs to be mounted has been suggested as a way to reduce a footprint of the ICs.

Such a chip stack is classified into a package stack and a bare chip stack. The bare chip stack has a relatively small footprint and the advantage of small size compared to the package stack.

Many chip stacking methods have been suggested to date. The package stack has the disadvantage of involving a bulky process using wire bonding or a chip carrier. This results in large inductance which degrades the performance of ICs. Thus, the chip stack better facilitates miniaturization.

PCT/US1999/09744, entitled "Chip Stack and Method of Making the same" discloses a conventional chip stack technique using a carrier. The method involves stacking chips by putting a chip on a chip carrier and forming a bump on the carrier. However, conventional art using the chip carrier has the problem of a large footprint.

U.S. Pat. No. 6,395,630, entitled "Stacked Integrated Circuits" discloses a chip stack technique in which a bump is formed in the chip such that a hole having an aspect ratio of 100 to 200 is formed to penetrate a wafer and a coaxial conductor is formed in the hole using a chemical vapor deposition (CVD) technique.

However, the conventional art in which the bump is formed in the chip has several problems. These are, it is difficult to form a hole having a high aspect ratio, a process for forming the coaxial conductor in the hole using the CVD technique has a low deposition rate (e.g., 100 Å/min) and requires a long processing time, and an inner conductor process and an outer conductor process should be performed separately.

SUMMARY OF THE INVENTION

The present invention is directed to a chip, a chip stack, and a method of manufacturing the same in which a plurality of chips, which each comprise at least one pad formed on a wafer and a metal layer which protrudes up to a predetermined thickness from the bottom of the wafer in a via hole penetrating the wafer to expose the bottom of the pad, are stacked such that the pad and the metal layer of adjacent chips are bonded. This leads to a simplified manufacturing process, high chip performance and a small footprint for a chip stack.

A first aspect of the present invention provides a chip, comprising: at least one pad formed on a wafer; and a metal layer formed to protrude up to a predetermined thickness from the bottom of the wafer in a via hole penetrating the wafer to expose the bottom of the pad.

A second aspect of the present invention provides a chip stack, comprising: a plurality of chips which include at least one pad formed on a wafer and a metal layer formed to protrude up to a predetermined thickness from the bottom of the wafer in a via hole penetrating the wafer to expose the bottom of the pad, wherein the pad and the metal layer of adjacent chips are bonded to each other.

A third aspect of the present invention provides a method of manufacturing a chip, comprising: (a) depositing a seed metal layer on the entire surface of a wafer on which at least one pad is formed; (b) lapping a lower portion of the wafer so that the wafer has a predetermined thickness and then forming a via hole forming pattern on the exposed wafer; (c) etching the wafer to expose the bottom of the pad using the via hole forming pattern as an etching mask to form a via hole; and (d) forming a plated metal layer to protrude up to a predetermined thickness from the bottom of the wafer in the via hole to contact the exposed bottom of the pad and then removing the seed metal layer and the via hole forming pattern.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1:
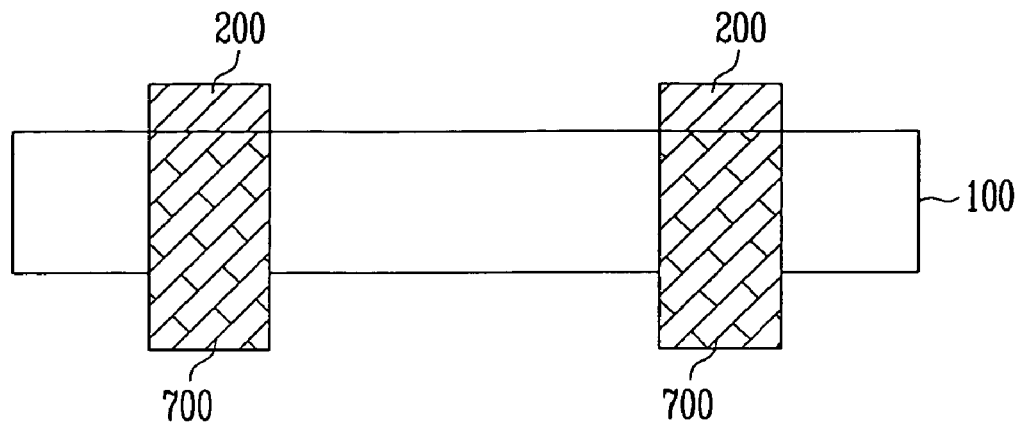
FIG. 1 is a cross-sectional view of a chip according to an exemplary embodiment of the present invention.
Figure 2:
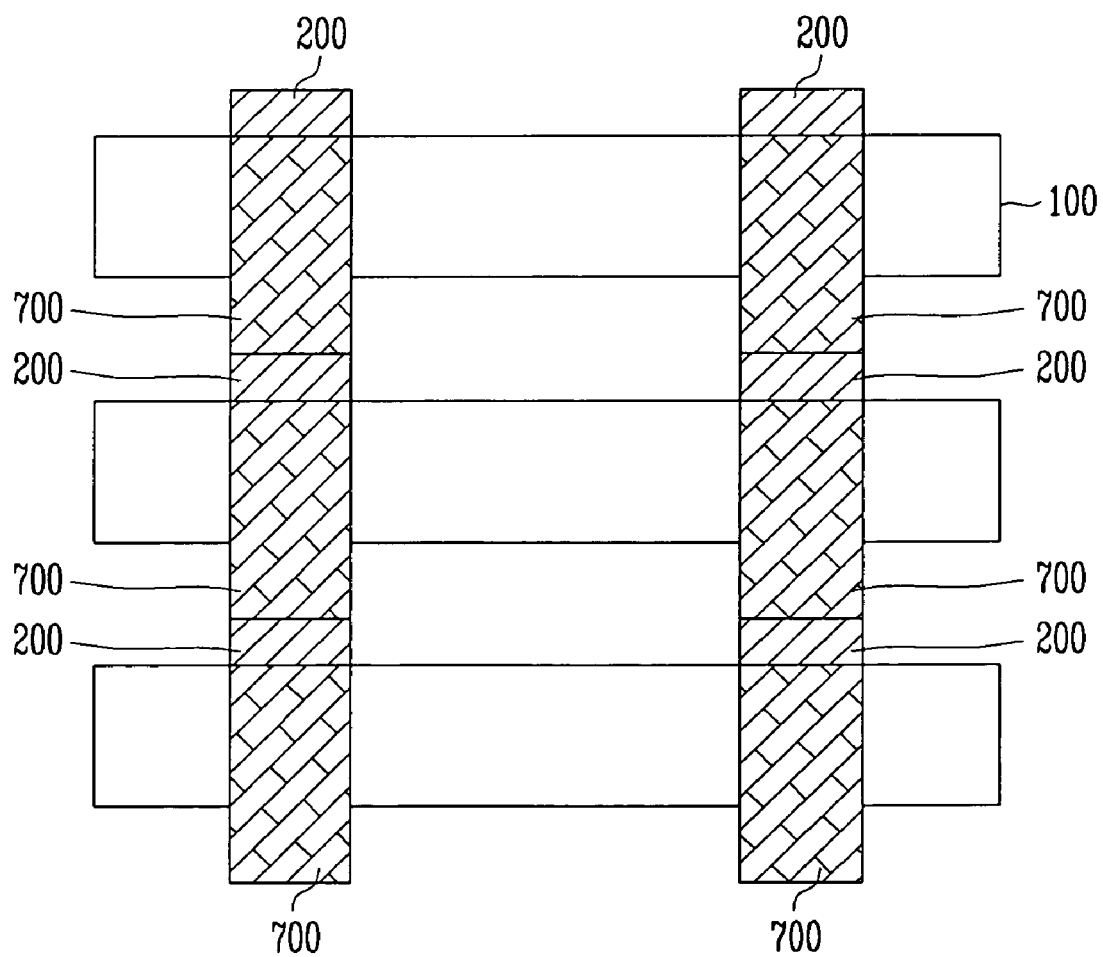
FIG. 2 is a cross-sectional view of a chip stack according to an exemplary embodiment of the present invention.

FIG. 1 is a cross-sectional view of a chip according to an exemplary embodiment of the present invention, and FIG. 2 is a cross-sectional view of a chip stack according to an exemplary embodiment of the present invention.

Referring to FIG. 1, the chip of the present invention comprises at least one pad 200 formed on a wafer 100, a via hole (see 600 in FIG. 3e) which penetrates the wafer to expose the bottom of the pad 200, and a metal layer 700 which protrudes from the bottom of the wafer 100 by a predetermined thickness.

Referring to FIG. 2, the chip stack of the present invention has a structure that a plurality of chips are stacked so that the pad 200 and the metal line 700 of adjacent chips are bonded to each other.

For the convenience of description, FIG. 2 shows that only three chips are stacked, but the number of chips to be stacked is not limited. That is, two or more chips can be stacked.

FIGS. 3a to 3g are cross-sectional views illustrating a method of manufacturing a chip according to an exemplary embodiment of the present invention.

Figure 3A:
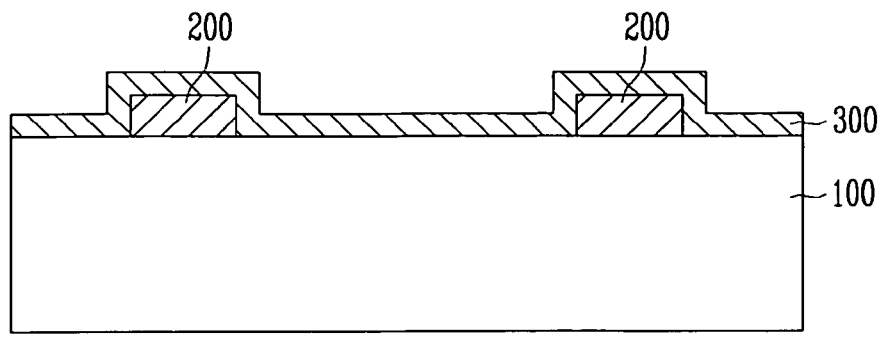
FIGS. 3a to 3g are cross-sectional views illustrating a method of manufacturing a chip according to an exemplary embodiment of the present invention.

Referring to FIG. 3a, at least one pad 200 is formed on a wafer 100 at a regular interval, and then a seed metal layer 300 is deposited on the entire surface of the wafer 100 including the pad 200. The seed metal layer 300 is made of, e.g., titanium/copper (Ti/Cu) and deposited by a sputtering technique. The titanium/copper (Ti/Cu) layer is formed to a thickness of about 400 Å to 600 Å/2000 Å to 4000 Å (preferably, about 500 Å/3000 Å).

The seed metal layer 300 serves as an electrode when, e.g., an electroplating technique is used to fill a metal layer (see 700 in FIG. 3f) in a via hole (see 600 in FIG. 3e) which will be described later.

Figure 3B:
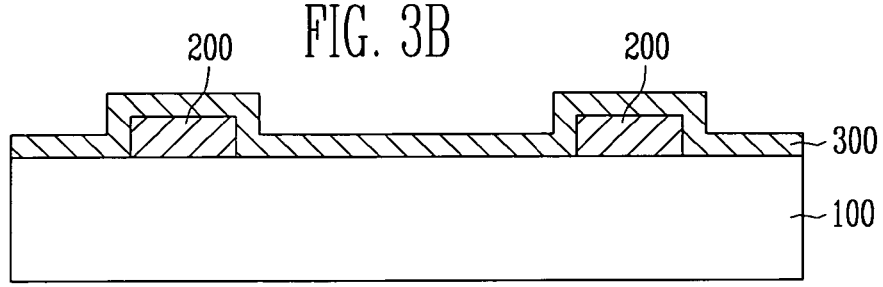

Referring to FIG. 3b, the bottom surface of the wafer 100 is subjected to a lapping process so that the wafer 100 has a relatively thin thickness of about 100 μm to 400 μm (preferably, about 300 μm).

Figure 3C:
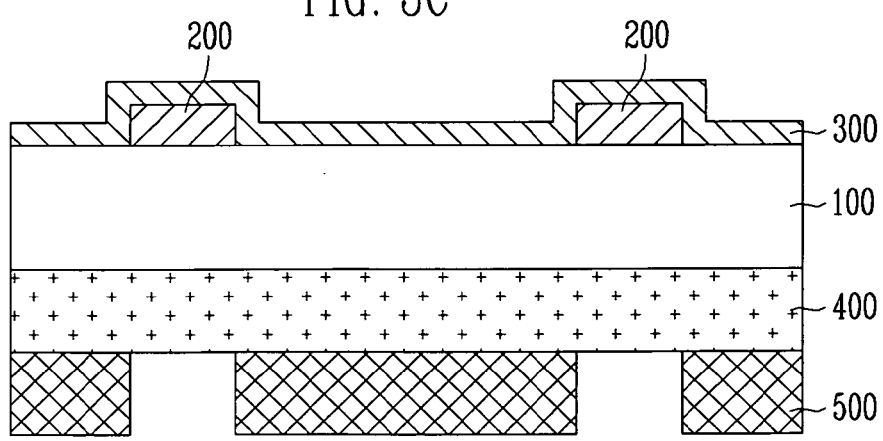

The lapping process may reduce a processing time of a dry-etching process for forming the via hole (see 600 in FIG. 3e) since it reduces the thickness of the wafer 100. The lapping process may also reduce a plating time when an electroplating technique is used to form the metal layer (see 700 in FIG. 3f) in the via hole. In addition, the thickness of the metal layer 700 can be easily adjusted by reducing an aspect ratio of the via hole 600. Referring to FIG. 3c, an oxide layer 400 is deposited on the exposed bottom of the wafer 100, and then a photoresist is coated on the oxide layer 400. The photoresist is etched by exposure and developing techniques using a via hole forming mask (not shown) to thereby form a photoresist pattern 500.

Figure 3D:
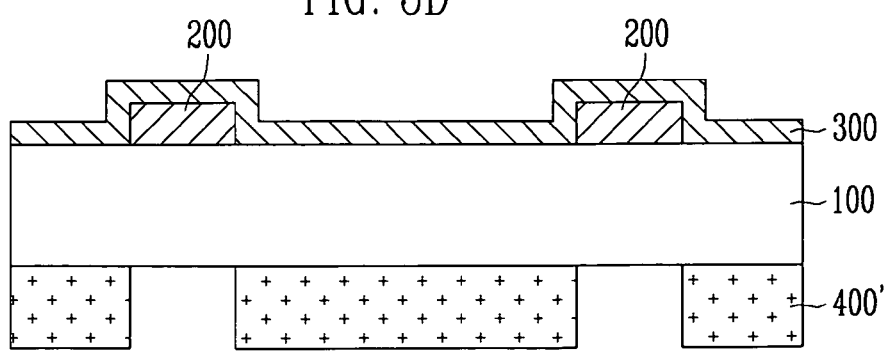

Referring to FIG. 3d, the oxide layer 400 is etched using the photoresist pattern (see 500 in FIG. 3c) as an etching mask, and then the photoresist pattern 500 is removed, thereby forming a pattern 400' for forming a via hole.

Here, the oxide layer 400 is preferably dry-etched by reactive ion etching (RIE) equipment using, e.g., $CF_4$ or $CHF_3$.

Figure 3E:
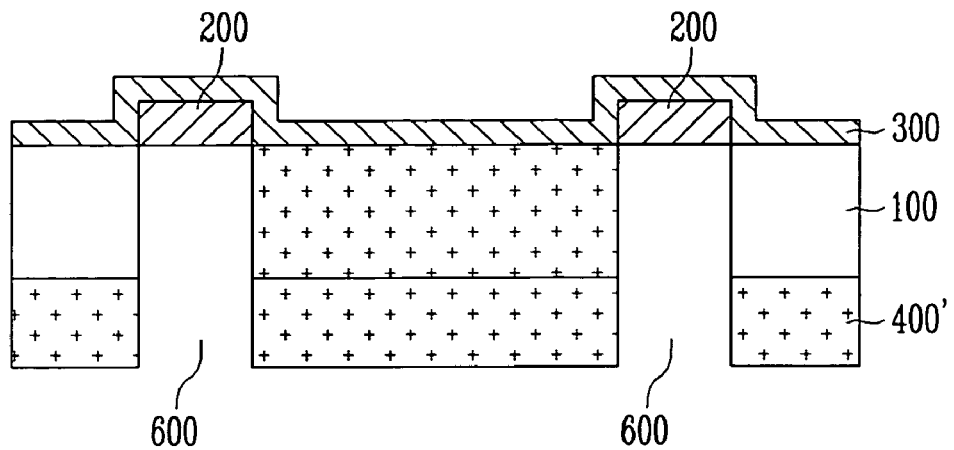

Referring to FIG. 3e, the wafer 100 is etched using the via hole forming pattern 400' as an etching mask to expose the bottom of the pad 200, thereby forming the via hole 600 having a constant aspect ratio (e.g., about 1 to 3).

Preferably, the via hole 600 is formed by a dry etching technique employing the RIE equipment using a gas containing fluorine (F) such as $C_4F_8$ and $SF_6$ to etch silicon (Si) or a gas such as $SF_6$ and $BCl_3$ to etch a gallium arsenide (GaAs).

Figure 3F:
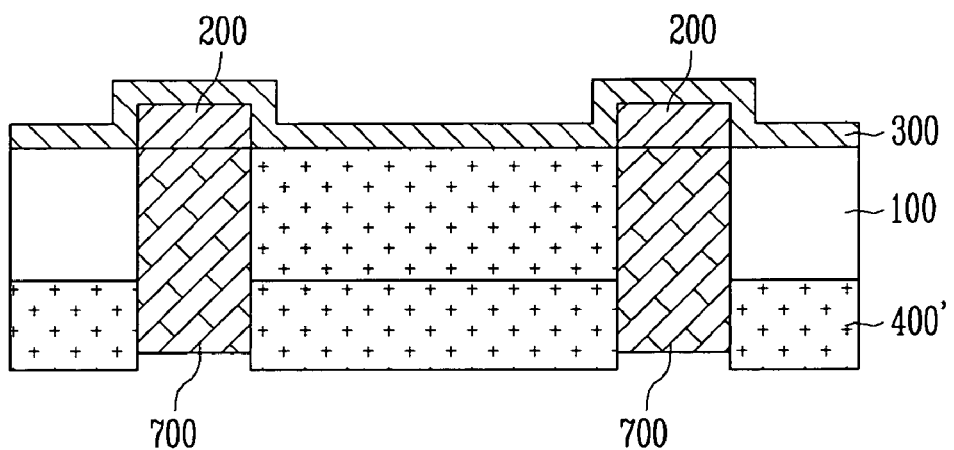

Referring to FIG. 3f, the wafer 100 is mounted in plating equipment of a fountain type to which a lead free solder solution is sprayed, and a plating metal layer 700 is formed in the via hole 600 to protrude up to a predetermined thickness from the bottom of the wafer in the via hole using an electroplating technique so that the plating metal layer 700 contacts the exposed bottom of the pad 200.

At this time, the metal layer 700 is formed such that a first metal layer is formed to a predetermined thickness by the electroplating technique using a copper plating solution and then a second metal layer is formed on the first metal layer to protrude up to a predetermined thickness from the bottom of the wafer 100 by the electroplating technique using a plating solution which is lead-free and has a low melting point such as stannum/copper (Sn/Cu), stannum (Sn) and stannum/bismuth (Sn/Bi).

Here, a portion of the metal layer 700 from the bottom of the pad 200 to the bottom of the wafer 100 is referred to as a via metal layer, and a portion of the metal layer which protrudes up to a predetermined thickness from the bottom of the wafer 100 is referred to as a bump.

When the metal layer 700 is formed by the electroplating technique, the plating speed is fast and uniformity of the plating layer can be adjusted within about 5%, and thus the bump with a thickness of several tens of micrometers μm can be formed in a short time.

Figure 3G:
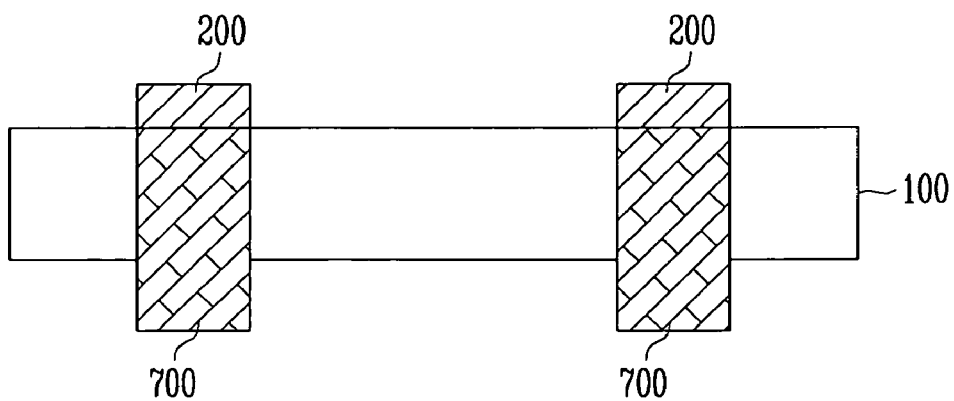

Referring to FIG. 3g, the seed metal layer 300 and the via hole forming pattern 400' are etched and thus removed, thereby completing the chip having the bump protruding from the bottom of the wafer 100 according to the present invention.

The chip stack of FIG. 2 can be formed by stacking at least two chips manufactured with reference to FIGS. 3a to 3g in the way that the pad 200 and the metal layer 700 are bonded by a fusion bonding technique.

As described above, since the protruding bump is formed on the bottom of the wafer 100, there is no need for flip when the chips are stacked, and since the bump made of a lead free metal has a low melting point of about 220° C., it can be melted on a typical hot plate, leading to high processing efficiency.

The chips can be stacked using the bump protruding from the bottom of the chip without a conventional adhesive, and the bump serves as a heat path for dissipating heat generated in the chip, and thus the present invention has an advantage in that heat dissipation efficiency is improved and the footprint is reduced compared to conventional chip stack technology using a wire.

As described above, according to the present invention, a chip, a chip stack, and a method of manufacturing the same have an advantage in that at least one pad is formed on the wafer, and the metal layer which protrudes up to a predetermined thickness from the bottom of the wafer is formed in the via hole penetrating the wafer to expose the bottom of the pad, i.e., a signal of the pad is leaded to the bottom of the chip, so that a metal layer, i.e., a bump protruding from the bottom of the wafer can be formed without redistributing the signal line, leading to a simplified manufacturing process.

Further, since the bump protruding from the bottom of the wafer serves as an interconnection point as well as a contact point when the chips are stacked, the bonding length is short and degradation of the chip performance is small compared to the interconnection of the conventional art using wire boding.

Furthermore, it is easy to stack the chips and it is possible to stack the chips using the bump, and thus the footprint for the chip stack can be small, and since the bump serves as a heat sink for dissipating the heat generated from the chips when the chips are stacked, heat dissipation efficiency is improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a chip, comprising:
   (a) depositing a seed metal layer on an entire upper surface of a wafer on which at least one pad is formed, the seed metal layer being deposited over the at least one pad;
   (b) lapping a lower portion of the wafer forming an exposed wafer bottom so that the wafer has a predetermined thickness and then forming a via hole forming pattern on the exposed wafer bottom;
   (c) etching the wafer to expose the bottom of the pad using the via hole forming pattern as an etching mask to form a via hole; and
   (d) forming a plated metal layer to protrude up to a predetermined thickness from the bottom of the wafer in the via hole to contact the exposed bottom of the pad and then removing the seed metal layer and the via hole forming pattern.

2. The method of claim 1, wherein the seed metal layer is deposited by a sputtering technique using titanium/copper (Ti/Cu).

3. The method of claim 2, wherein the titanium/copper has a thickness of 400 Å to 600 Å and 2000 Å to 4000 Å, respectively.

4. The method of claim 1, wherein in step (b), the predetermined thickness of the wafer is 100 μm to 400 μm.

5. The method of claim 1, wherein step (b) comprises
   (b-1) lapping the lower portion of the wafer to have a predetermined thickness, and then sequentially forming an oxide layer and a photoresist on the exposed wafer;
   (b-2) etching the photoresist to form a photoresist pattern for forming the via hole; and
   (b-3) etching the oxide layer using the photoresist pattern as an etching mask, and then removing the photoresist pattern to form a via hole forming pattern.

6. The method of claim 5, wherein in step (b-3), the oxide layer is dry-etched using $CF_4$ or $CHF_3$.

7. The method of claim 1, wherein in step (c), the via hole is formed by a dry etching technique using one of $C_4F_8$, $SF_6$, and $BCl_3$ gases.

8. The method of claim 1, wherein in step (d), the metal layer is formed such that a first metal layer is formed by an electroplating technique to have a predetermined thickness from the bottom of the pad using a copper and a second metal layer is formed by an electroplating technique on the first metal layer to protrude up to a predetermined thickness from the bottom of the wafer using one of stannum/copper (Sn/Cu), stannum (Sn) and stannum/bismuth (Sn/Bi).

* * * * *